United States Patent
Skinner et al.

(10) Patent No.: US 6,727,752 B2
(45) Date of Patent: Apr. 27, 2004

(54) MODULATION SCHEME FOR SWITCHING AMPLIFIERS TO REDUCE FILTERING REQUIREMENTS AND CROSSOVER DISTORTION

(75) Inventors: David L. Skinner, Dallas, TX (US); Wayne Tien-Feng Chen, Plano, TX (US); David A. Grant, Dallas, TX (US); Vadim Ivanov, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 10/156,926

(22) Filed: May 29, 2002

(65) Prior Publication Data

US 2003/0222713 A1 Dec. 4, 2003

(51) Int. Cl.[7] .............................................. H03F 3/217
(52) U.S. Cl. ................................... 330/251; 330/207 A
(58) Field of Search ............................ 330/251, 207 A, 330/78, 79

(56) References Cited

U.S. PATENT DOCUMENTS

| | | | |
|---|---|---|---|
| 5,764,103 A | 6/1998 | Burra et al. | |
| 5,905,407 A | 5/1999 | Midya | |
| 5,973,368 A | * 10/1999 | Pearce et al. | ................. 257/368 |
| 6,016,075 A | 1/2000 | Hamo | |
| 6,127,885 A | 10/2000 | Colangelo | |
| 6,150,880 A | * 11/2000 | Schweighofer | ......... 330/207 A |
| 6,211,728 B1 | * 4/2001 | Chen et al. | ...................... 330/10 |
| 6,262,632 B1 | 7/2001 | Corsi et al. | |
| 6,351,184 B1 | 2/2002 | Miao et al. | |
| 6,597,241 B1 | * 7/2003 | Moeneclaey et al. | .......... 330/10 |

* cited by examiner

Primary Examiner—Henry Choe
(74) Attorney, Agent, or Firm—W. Daniel Swayze, Jr.; W. James Brady; Frederick J. Telecky, Jr.

(57) ABSTRACT

A modulation scheme can drive an associated load that is coupled between a pair of outputs by providing a switching signal at one of the outputs and a non-switching signal at the other output independent of the direction of current relative to the respective outputs. Because switching occurs only at one of the outputs in this mode of operation, a single filter can be used to mitigate switching noise at the switching output. Another aspect relates to another mode of operation in which one or both of the outputs can be controlled to operate linearly, such as during a zero crossing condition, so as to help reduce crossover distortion.

31 Claims, 6 Drawing Sheets

MODULATION SCHEME FOR SWITCHING AMPLIFIERS TO REDUCE FILTERING REQUIREMENTS AND CROSSOVER DISTORTION

TECHNICAL FIELD

The present invention relates generally to a modulation scheme for driving a load and, more particularly, systems and methods to implement a modulation scheme for a switching amplifier that can reduce filtering requirements and crossover distortion.

BACKGROUND OF THE INVENTION

There are two common approaches utilized to drive a load with a desired voltage or current. These are using a switching amplifier or a linear amplifier to drive the load. Various types of loads can be driven by these approaches, including, for example, motors or actuators, thermoelectric coolers and/or heaters, and audio speakers, to name a few.

In the switching amplifier approach, output transistors are switched, or pulse-width modulated, at a frequency usually much higher than the frequency of interest in an application. The result is that the transistors are on only when they need to supply current. The pulses vary in duration to change the amount of voltage or current being applied. The longer the pulse, the more energy applied to the load and the shorter the pulse, the less energy applied to the load. Thus, varying the length of the pulse can control power provided to the load and its associated operation.

By way of example, a typical PWM approach employs a pair of high-side and a pair of low side transistors in which one or more transistors at each of the high side and low side are pulse-width modulated to drive the load in a desired manner. The switching of the transistors tends to introduce undesirable noise to the load and surrounding circuitry. Accordingly, filters are needed to reduce switching noise. Further, because both sides implement switching in the conventional switching amplifier approach, a filter is needed at each of the sides of the load to reduce switching noise. Such filters can be significantly large, often occupying relatively large amounts of real estate on a printed circuit board (PCB).

The primary advantage of a switching amplifier is high efficiency, which allows for lower heat dissipation. A primary disadvantage of a switching amplifier is that it typically requires a bulky and/or costly output filters to block the switching waveform from reaching the load.

The switching amplifier is in contrast to a linear amplifier or regulator, which acts like variable resistor between the power supply voltage and the load to provide a desired voltage or current. The linear amplifier controls or drives the load with a controlled current or voltage, such as to control operation of the associated load. The linear driver, for example, operates one or more transistors in a linear region so as to achieve a desired signal to the load, such as a variable DC output. However, such operation tends to be quite inefficient because substantial power is dissipated when operating in this manner.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention relates generally to a modulation scheme that can be utilized to drive an associated load coupled between a pair of output nodes. In this scheme, controlled output signals are provided to each of the output nodes. The output signal provided at one output is a switching signal and the other output is non-switching. Because switching is implemented at only one side of the load, a single filter may be employed at the output to the load. As a result of using only a single filter, the area needed to implement a corresponding circuit can be reduced.

By way of example, such a scheme can be implemented to control a plurality of switching devices, such as arranged in a bridge configuration, to selectively energize a load coupled between a pair of output nodes. The switching devices can be coupled between a single power supply and ground. Respective switching devices associated with one of the output nodes are controlled in a switching mode (e.g., by pulsing or pulse-width modulating such switching devices) to provide a switching signal at that node regardless of current direction. A filter can be coupled between the load and this output node (e.g., the juncture between the respective switching devices). The switching devices associated with the other output node are controlled in a non-switching mode (e.g., by operating the switching devices in a steady state condition, such as on or off), which operation controls the direction of current flow through the load and provides a non-switching output signal at this node.

According to another aspect of the present invention, crossover distortion typically associated with a zero crossing condition can be reduced by providing a generally linear low voltage signal at one or more of the output nodes, such as by operating associated switching devices in linear modes. The switching devices employed in the linear mode can be part of a separate switching system or include the same switching devices that implementing the switching modulation scheme described above.

DETAILED DESCRIPTION OF THE INVENTION

The present invention relates to a modulation scheme that can be utilized to drive an associated load coupled between a pair of outputs. One aspect relates to a switching modulation scheme in which one of the outputs is switching and the other output is non-switching independent of the direction of current relative to the outputs. Because switching occurs only at one of the outputs in this mode of operation, a single filter can be used to mitigate switching noise at the switching output. According to another aspect, one or both of the outputs can be controlled to operate linearly, such as during a zero crossing condition, which helps reduce crossover distortion. It will be appreciated that each of these aspects can be implemented separately or in combination according to an aspect of the present invention.

Figure 1:
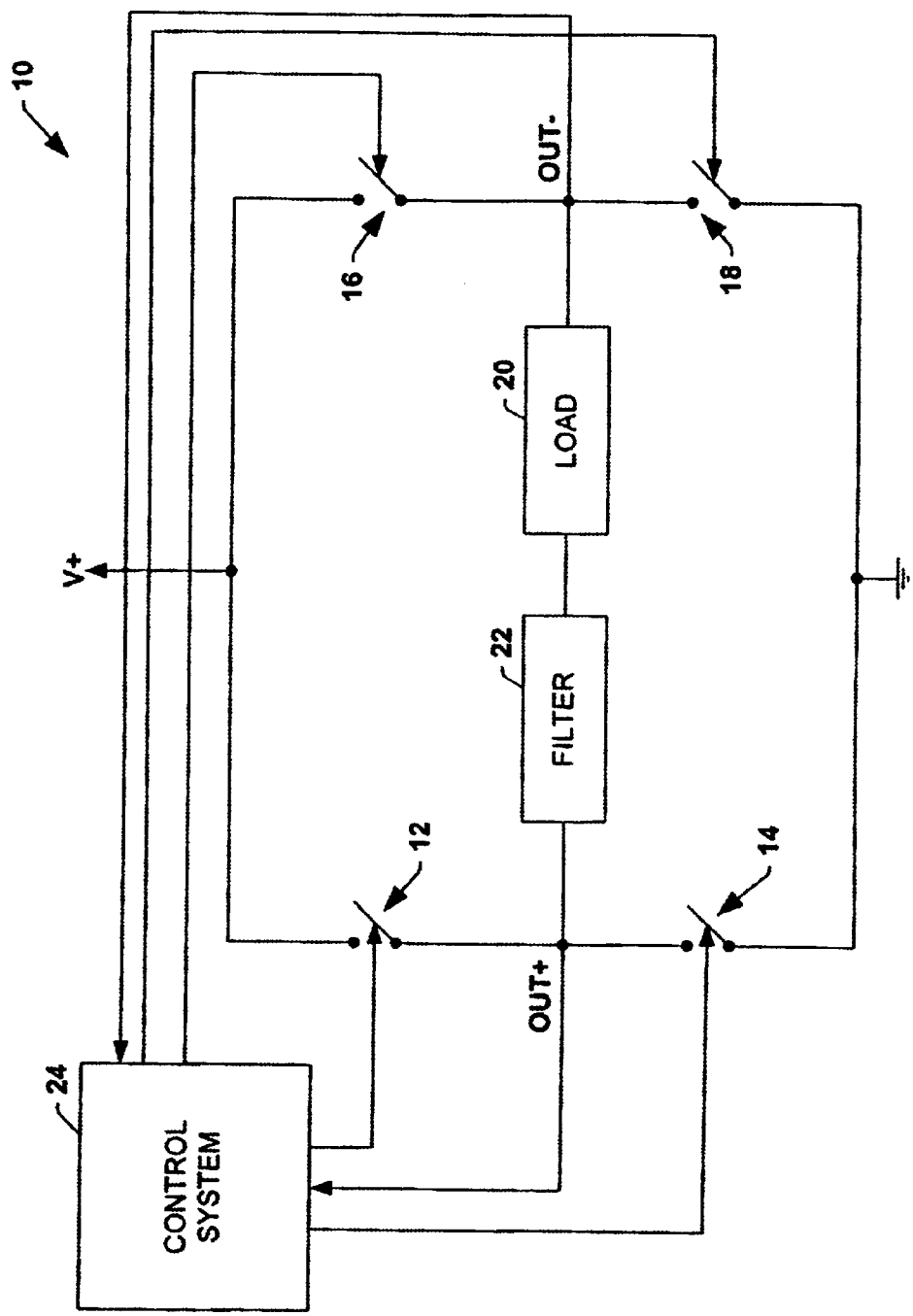
FIG. 1 is a block diagram of a system to implement a modulation scheme in accordance with an aspect of the present invention.

FIG. 1 illustrates a system 10 that can be utilized to implement one or more modulation schemes in accordance with an aspect of the present invention. The system 10 includes a first pair of switching devices 12 and 14 coupled in series between a single power supply, illustrated as having positive voltage V+, and ground. A juncture between the switching devices 12 and 14 corresponds to an output node indicated at OUT+. Another set of switching devices 16 and 18 also are coupled between V+ and ground. A juncture or node between the switching devices 16 and 18 corresponds to another output node, indicated at OUT−. A load 20 and output filter 22 are coupled in series between OUT+ and OUT−. The load 20, for example, can be a thermal electrical cooler, a motor, or actuator, an audio speaker or other device.

In accordance with an aspect of the present invention, the filter 22 is coupled between the load 20 and only one of the output nodes OUT+. While in the example illustrated in FIG. 1, the filter 22 is coupled between the load and OUT+, those skilled in the art will understand and appreciate that the filter alternatively could be coupled between the load and OUT− depending on the operation of the respective switching devices 12–18.

The system 10 also includes a control system (e.g., including a driver circuitry) 24 programmed and/or configured to control operation of the switching devices 12–18 according to an aspect of the present invention. In the particular configuration illustrated in the example of FIG. 1, the control system 24 controls one of the switching devices 12 or 14 located at the filter side of the switching network with a switching control signal (e.g., having a desired high frequency and duty cycle) to control the magnitude of current or voltage being applied to the load 20. This results in a switching output signal being provided at OUT+. The control system 24 also controls the switches 16 or 18 in a steady state (e.g., on or off) condition to control the direction of current or voltage potential being applied to the load. This results in a non-switching signal at OUT−. In this mode of operation (e.g., a switching mode), the switching signal occurs at OUT+ and the non-switching signal occurs at OUT− independent of the direction of current being supplied to the load.

By way of illustration, the control system 24 pulses switches 12 and 14 between on and off conditions at a high frequency and turns the switch 18 on and the switch 16 off, such that current flows from V+ or ground through the switch 12 or 14 respectively, through the filter 22 and load 20, through the switch 18 and to ground. The magnitude of current will depend on the duty cycle at which switching is implemented for the switching devices 12 and 14. For example, if the control system 24 provides a high duty cycle for the switching of the switching devices 12 and 14, it will be a high current flowing from the OUT+ to the OUT− through the load 20, and if a load duty cycle is used, a low current will flow from the OUT+ to the OUT− node. The control system 24 also can provide current in the opposite direction through the load 20, such by switching the devices 12 and 14 between on and off conditions while the switching device 16 is on. In this operating mode, the switch 18 would be in the off condition and the voltage at OUT+ would again depend on the duty cycle of the switches 12 and 14.

Because current flows only when one of the switches 12 or 14 is on, this approach can be highly efficient. Those skilled in the art will understand and appreciate that current may alternatively flow through diodes (e.g., flyback diodes) in parallel with the respective switches, depending on the operation of the respective switching devices 12 and 14. Additionally, because, in the switching mode, a switching output signal occurs only at OUT+, a single filter 22 can be used to reduce switching noise independently of the direction of current through the load 20. An alternative approach to providing the desired switching signal at OUT+ can be provided by, for example, switching one of the switches 12 or 14 while the other switch is off.

In accordance with another aspect of the present invention, the system 10 can operate to reduce distortion associated with zero crossing. In particular, the control system 24 can receive one or more input signals determine whether the potential across the load is near a zero crossing (e.g., the voltage potential between the output nodes is near zero volts). The input signal(s) can correspond to a sensed condition associated with the load voltage (e.g., corresponding to the voltage potential across OUT+ and OUT−) or correspond to a control signal indicating a desired voltage to be applied to the load 20. A zero crossing condition typically corresponds to a situation when the voltage or current being applied to the load is transitioning between a positive and negative or a negative and positive current. If normal operation of the system 10 were continued, as is common for most conventional systems, crossover distortion would result.

For example, a zero crossing condition can be determined based on the absolute value of the voltage potential being applied (or that is to be applied) across the load relative to a threshold, such as a low voltage near zero volts (e.g., about 30–50 mV). Those skilled in the art will understand and appreciate that other threshold levels could be utilized to detect a zero crossing associated with the differential outputs OUT+ and OUT− or associated with an input control signal.

In response to detecting a zero crossing condition, the control system 24 can operate the respective switching devices 12–18 in a linear mode, such that no switching is implemented at either OUT+ or OUT−. It will be understood that while no switching is being implemented, appropriate switching devices 12–18 can be controlled to provide desired linear voltages or switched to their respective on or off conditions.

Assume, for example, that in the switching mode (described above), positive current is flowing from OUT+ to OUT−, such as due to operation of the switching devices 12 and 14 operating in a switching mode and device 18 in the on condition. Once the control system 24 detects a zero crossing condition, the control system changes operation of the switching devices 12 and 14 to a linear mode such as to provide a low voltage linear output at OUT+. A transition from positive to negative current through the load can then be implemented by slowly turning on the switching device 14 while switching device 12 slowly turns off and, in turn, applying a linear control signal to the switching devices 16 and 18 so as to provide a desired substantially low voltage linear output at OUT−. The control system 24 then can increase the linear control of the switching devices 16 and 18 until the control system detects that the voltage across the load is no longer sufficiently near zero (e.g., a zero crossing condition no longer exists). This corresponds to a transition from the linear mode back to the switching mode, such as described above. Thus, the control system 24 controls the switching device 16 to its fully on condition and drives the switching devices 12 and 14 in their switching modes to once again control current in the switching mode.

It is to be appreciated that the linear voltages at OUT+ and OUT− in the linear mode can be provided by operating the switching devices 12 and 14 in a linear mode, as just described. Alternatively, the control system 24 can include another associated switching system (not shown), which can be separate from the switching system 12–18, coupled to provide the desired linear voltages to OUT+ and OUT− while operating in the linear mode. Those skilled in the art will understand and appreciate various approaches that could be utilized to achieve the modes of operation described above with respect to the system 10.

Figure 2:
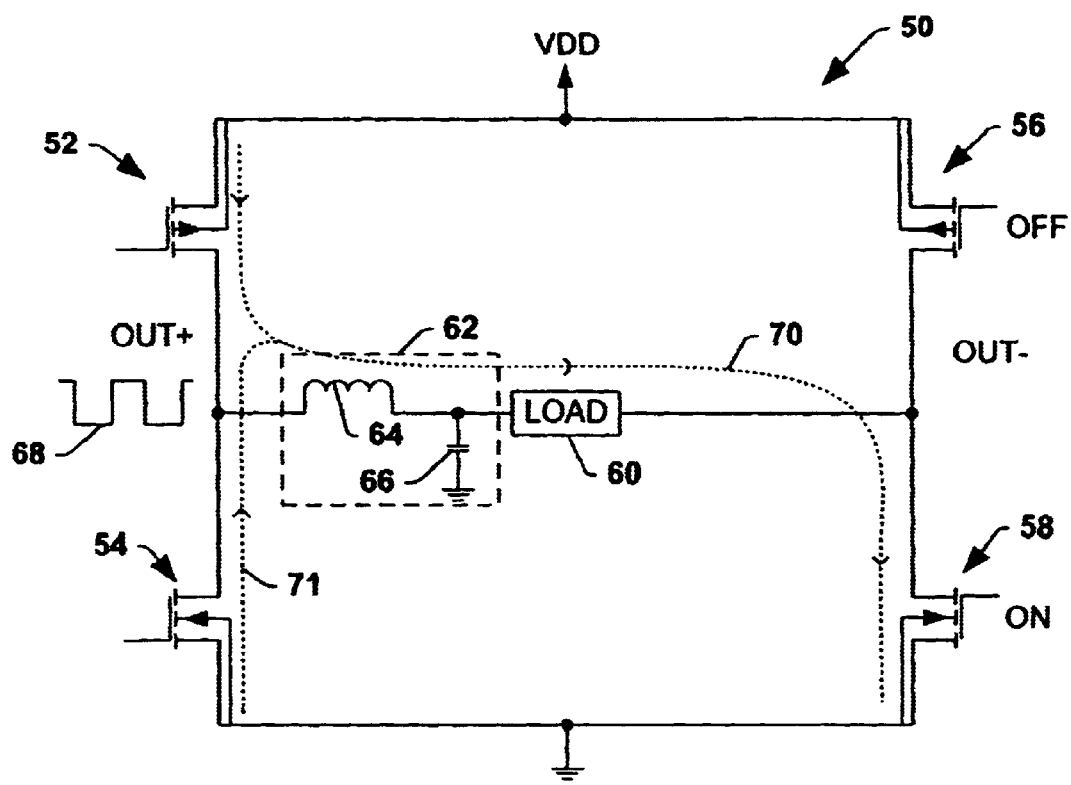
FIG. 2 is an example of a switching amplifier illustrating a load being driven in a switching mode with current in a first direction.
Figure 3:
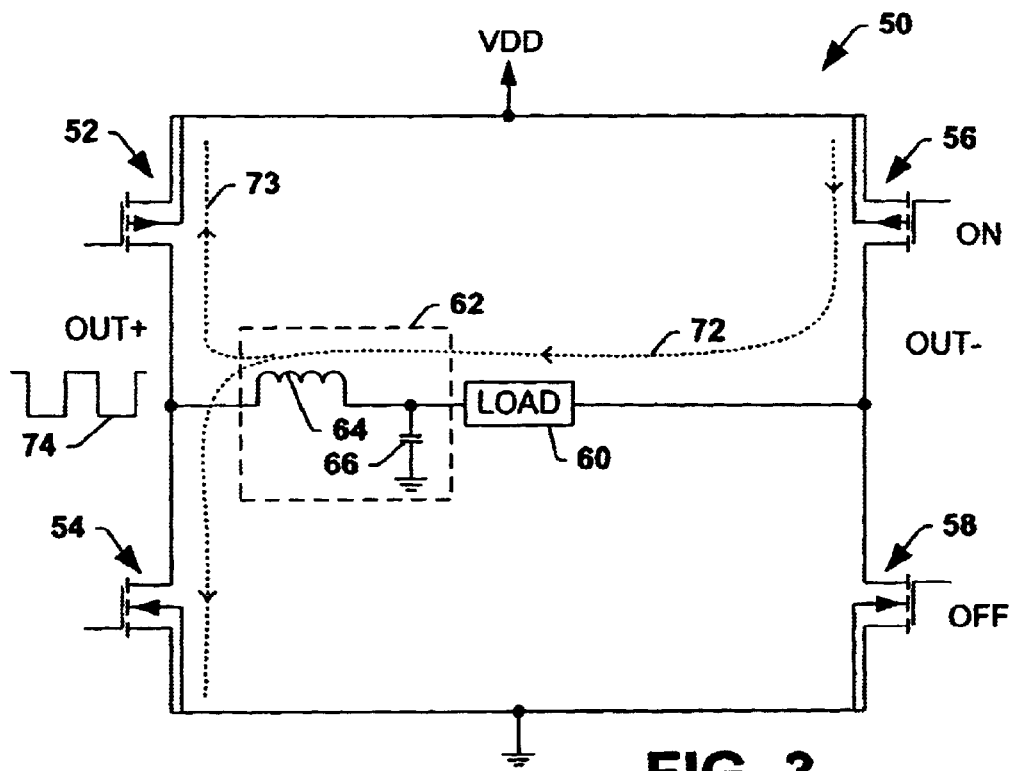
FIG. 3 is an example of the switching amplifier of FIG. 2 illustrating a load being driven in a switching mode with current in a second direction.

FIGS. 2 and 3 illustrate a switching system 50 in different operation conditions in accordance with an aspect of the present invention. The switching system 50 includes a plurality of transistors 52, 54, 56 and 58 connected in an H-bridge configuration between a single input voltage, indicated at VDD, and ground. Each of the transistors 52–58 includes a control input that receives a control signal from an associated control system to drive an associated load 60 in a desired manner. Additionally, each of the transistors 52–58 can include associated flyback diodes (not shown) in parallel with the transistors for mitigating shoot-through current during operation of the system 50.

In this example, an output filter 62 is coupled between an OUT+ node and the load 60, which load is also connected to the OUT− node. As used below, the transistors 52 and 54 are referred to as the filter-side transistors and the transistors 56 and 58 are referred to as load-side transistors. The filter 62 is illustrated as an LC filter (e.g., a low pass filter) formed of an inductor 64 and a capacitor 66. The filter 62 is designed to remove AC or switching components from the signal at OUT+ and, in turn, provide a corresponding DC signal to the load 60. The filter 62 can be, for example, a second order LC filter, although other types of filters could be utilized to appropriately filter the switching signal at OUT+ to a corresponding substantially DC signal. In situations when another signal is being modulated on the DC signal (e.g., for audio applications), the cut-off frequency of the filter 62 should be selected to allow the signal to pass unimpeded to the load 60.

In this particular example, the transistors 52 and 56 are illustrated as PMOS Field Effect Transistors (FETs) and the transistors 54 and 58 are illustrated as NMOS FETs. Those skilled in the art will understand and appreciate that any type of transistor or other type of switching device could be utilized (with appropriate modifications to the driver control circuit) to enable the appropriate modes of control according to an aspect of the present invention.

As illustrated in FIG. 2, a switching signal, indicated schematically at 68, is applied at OUT+ due to switching control applied to the gates of the transistors 52 and 54. The transistor 56 is off and the transistor 58 is in an on condition. As a result, current flows in a path as indicated by the dotted line 70 when transistor 52 is on and by the dotted line 71 when transistor 54 is on. Those skilled in the art will understand and appreciate that current may alternatively flow through diodes in parallel with the transistors 52 and 54, depending on the operation of the respective transistors 52 and 54. The magnitude of the voltage at OUT+ will depend on the duty cycle at which the transistor 52 is switched. The filter 62 operates to filter the switching signal at OUT+ to provide a corresponding DC signal to the load 60.

FIG. 3 illustrates the switching system 50 having an identical configuration to that shown and described with respect to FIG. 2, such that identical reference numbers are used to refer to parts previously identified in FIG. 2. However, in the example of FIG. 3, current is flowing in the opposite direction through the load 60 along the path shown by dotted lines 72 and 73. This type of control is implemented by an associated driver applying a switching signal to the gates of the transistors 52 and 54 with a duty cycle to achieve a desired voltage across and current through the load 60. The transistor 58 is off and the transistor 56 is activated to its on condition. As a result, a switching signal, indicated at 74, is provided at OUT+. The filter 62 filters the switching signal 74 so as to provide a corresponding generally DC signal to the load 60. The OUT− node is directly coupled to VDD through the transistor 56, which is activated to its on condition.

In view of the examples just described with respect to FIGS. 2 and 3, those skilled in the art will understand and appreciate that only a single filter 62 is needed to provide both positive and negative DC current relative to the load 60. This is because such a modulation scheme only provides a switching output signal at OUT+ (e.g., due to switching control of transistor 52 and transistor 54 and non-switching control of transistors 56 and 58) independent of the direction of current. As a result, there can be a substantial space saving in a circuit that employs the modulation scheme according to an aspect of the present invention.

Figure 4:
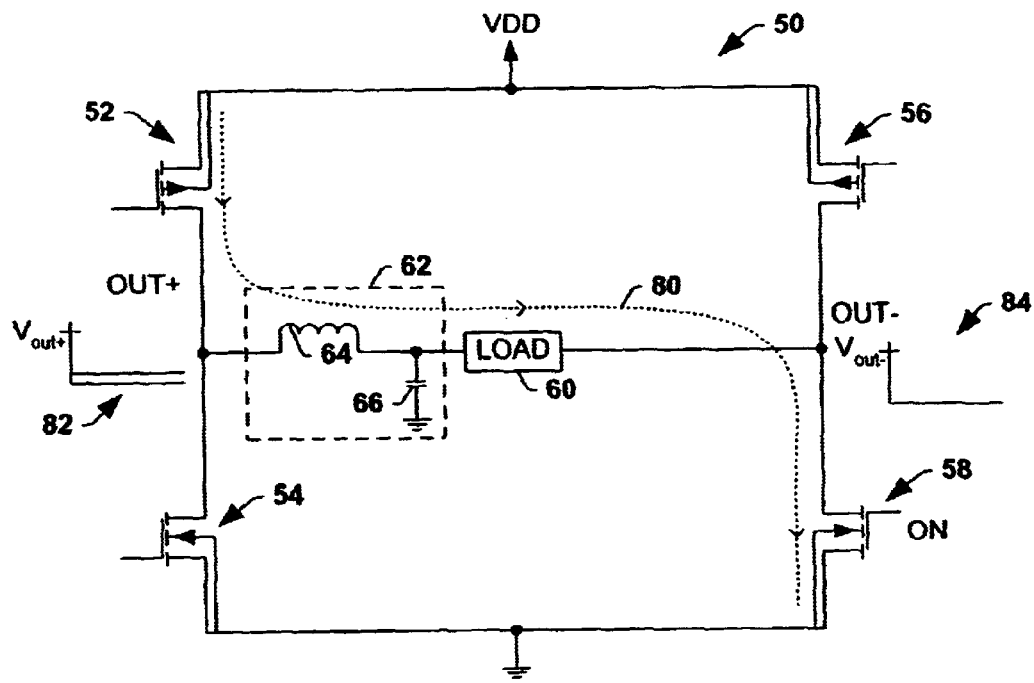
FIG. 4 is an example of the switching amplifier of FIG. 2 illustrating a load being driven in a linear mode with current in a first direction.
Figure 5:
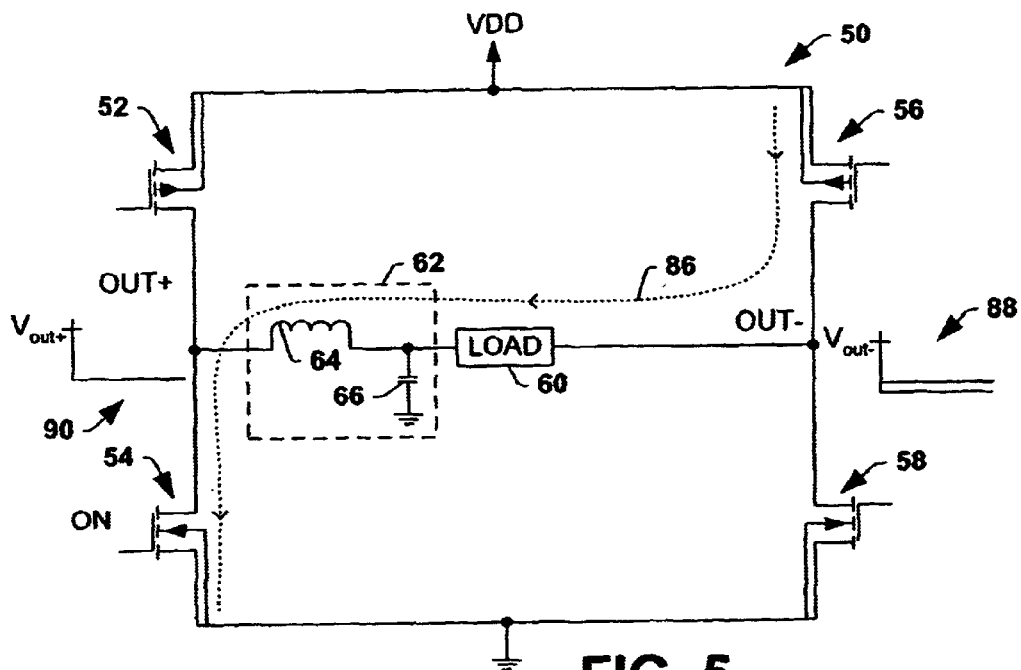
FIG. 5 is an example of the switching amplifier of FIG. 2 illustrating a load being driven in a linear mode with current in a second direction.

FIGS. 4 and 5 illustrates switching systems 50 that are identical in configuration to those described with respect to FIGS. 2 and 3, and thus identical reference numbers have been used to indicate like parts previously identified with respect to those figures. In particular, FIGS. 4 and 5 illustrate two possible operating conditions that can be implemented by the switching system 50 when the voltage being applied across the load is near zero volts, corresponding to a zero crossing condition. As described herein, a zero crossing condition can be determined to exist, for example, when the absolute value of the voltage potential between OUT+ and OUT− is about 30–50 mV or when a control signal seeks to drive the differential output within such a level. Of course, other threshold levels can be utilized to ascertain the occurrence of a zero crossing condition.

In the example of FIG. 4, the switching system 50 is operated such that load current flows in a path indicated by dotted line 80. A small bias current also may flow through the transistor 54. The current flowing through the load 60 is a low level current, as the transistors 52 and 54 are being operated in their linear regions due to a low potential being applied to their gates by their associated drivers. Accordingly, there is a generally linear voltage at OUT+ indicated at 82. The switching device 56 is in its off condition during this mode. The switching device 58, however, is activated to its on condition, such that a zero voltage (indicated schematically at 84) exists at OUT− due to its connection to ground. It is to be appreciated that when operating in this mode, the filter 62 could be eliminated from the switching system 50 or that the output voltages (e.g., $V_{out+}$ and $V_{out-}$) could be applied directly to the load 60. For example, the switching system utilized during a zero crossing condition to energize the load 60 could be a separate switching system from that used when the system is not operating in the zero crossing mode.

In FIG. 5, current flows through the load 60 along the path indicated by dotted line 86. To achieve this operation, the transistor 52 is off, the transistor 54 is on and the transistors 56 and 58 operate in their linear region due to a low-level DC (e.g., non-switching) control signal from their associated drivers. As a result, a low voltage is applied at OUT− (schematically indicated at 88), which voltage varies as a function of the gate control signal provided to the transistor 56. Similarly the voltage at OUT+ is low or at ground, as indicated at 90. Because the system 50 operates in a linear mode (e.g., based on control from a linear driver) when the output voltage is near the zero crossing region, noise performance and overall linearity of the system can be significantly improved in accordance with an aspect of the present invention.

Figure 6:
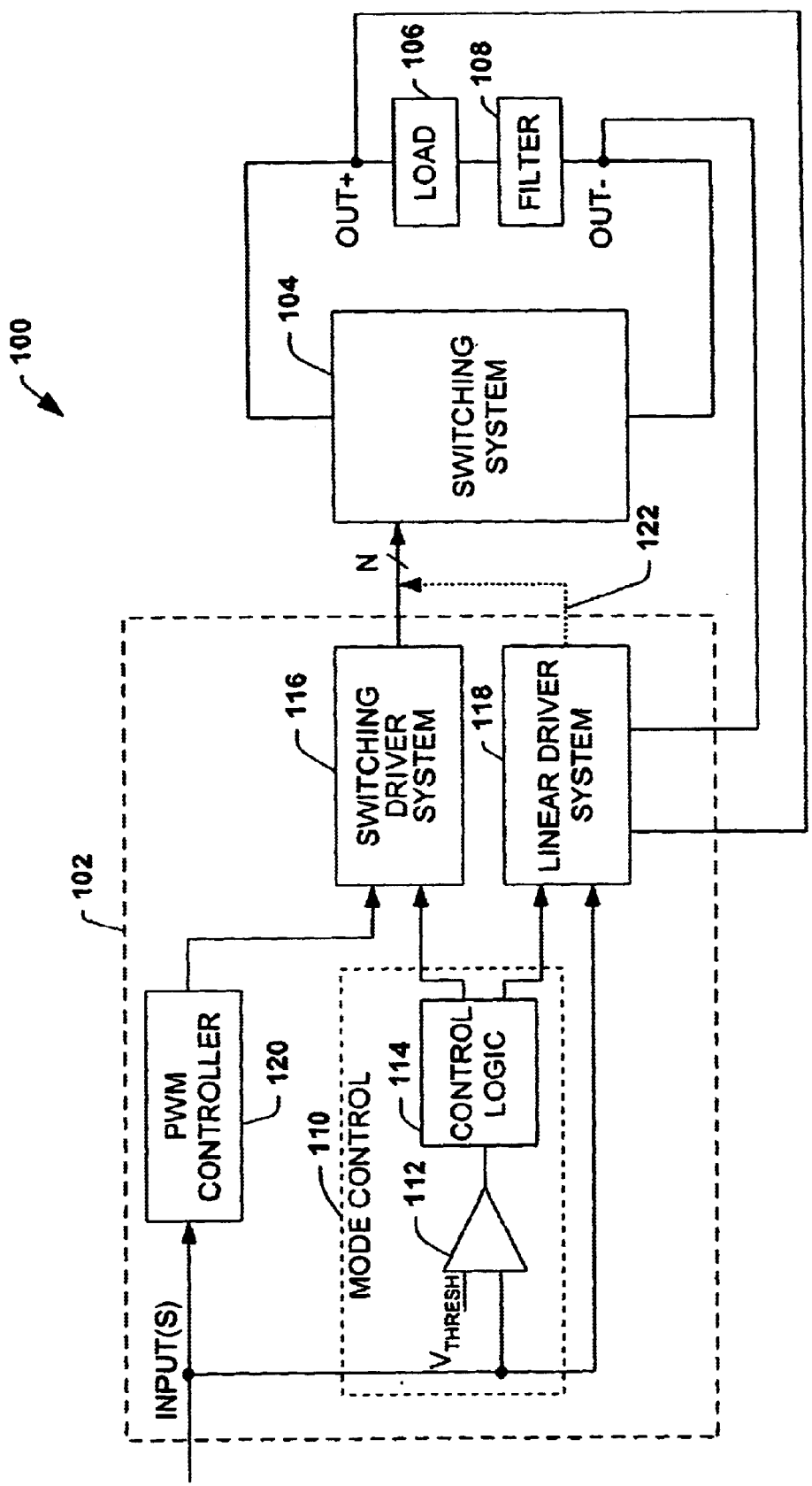
FIG. 6 is a block diagram illustrating a hybrid amplifier system that can drive a load in a switching mode and a linear mode in accordance with an aspect of the present invention.

FIG. 6 illustrates a system 100 for implementing a modulation scheme in accordance with another aspect of the present invention. In this example, the system 100 includes a control system 102 able to implement both a switching amplifier and a linear amplifier (e.g., a hybrid linear-switching controller). The switching system 100 includes a switching system 104, such as a plurality of switching devices (e.g., MOSFETs) arranged in a desired configuration to supply electrical energy relative to a load 106. An output filter 108 is coupled between the load and the switching system 104. In the example illustrated in FIG. 6, load 106 is coupled in series with the filter 108 between the OUT+ and OUT− nodes of the switching system 104. Specifically, the filter 108 is coupled between the load 108 and the OUT− output node. It is to be appreciated that the filter could be implemented within the switching system or as part of the load 106.

The control system 102 includes a mode control block 110 that receives one or more inputs, such as from external circuitry. The input, for example, can indicate the voltage across the load 106, such as based on the voltage at OUT+ and OUT−. Alternatively or additionally, the input can correspond to an input derived from associated control circuitry (analog and/or digital) that indicates a desired output level to apply to the load 106. In this example, the mode control block 110 includes a comparator 112 that compares the input relative to a threshold voltage indicated at $V_{thresh}$. For example, $V_{thresh}$ can be equal to about 30–50 mV or some other voltage level based on which a determination can be made as to whether a zero crossing condition exists. The comparator provides a corresponding output to control logic 114.

The control logic 114 is programmed and/or configured to determine whether a zero crossing condition exists based on the comparator output. The control logic 114 enables operation of associated switching driver system 116 and a linear driver system 118, generally mutually exclusively. The mode control block 110 thus controls whether the switching system 100 will operate in a linear mode or a switching mode based on the input. The linear mode is utilized for providing low voltage or low current to the load, namely, during a zero crossing condition so as to reduce crossover distortion and improve linearity. The switching mode can be utilized as the operating mode to drive the load during normal operating conditions to provide efficient operation.

In the switching mode, for example, the control logic 114 of the mode control block 10 can enable the switching driver system 116 to drive one side of the switching system 104 in a switching mode, such as to provide a switching output at OUT−. The switching driver includes a driver that provides an output to control each of the N switching devices (e.g., transistor) in the switching system 104, where N is a positive integer. The switching output at OUT− is provided by operating one or more switching devices coupled to the OUT− node (e.g., filter-side switches) in a switching mode and the other switching devices in a generally steady state or non-switching condition (e.g., either an on or off condition).

The switching driver system 116 also receives one or more signals from a PWM controller 120, which signals are used to generate control signals for selectively activating or deactivating switches in the switching system 104. That is, the PWM controller 120 provides control signals indicating how respective switches in the switching system 104 should be activated or deactivated based on the input(s). The switching driver system 116 provides a corresponding control signal to selectively activate and deactivate (e.g., gate) the switching devices of the switching system 104 based on the signal(s) from the PWM controller 120. As a result, the switching system 104 provides a voltage across OUT+ and OUT− generally corresponding to the voltage indicated by the input(s) to the PWM controller 120 according to an aspect of the present invention.

In the linear mode, for example, the linear driver system 118 is enabled by the control logic 114 of the mode control 110 so as to provide a substantially linear voltage at one of the OUT+ or OUT− nodes. The linear driver system 118 may also receive the input(s) that are provided to the PWM controller 120 and the mode control block 110. The linear driver system 118 is programmed and/or configured to determine how to operate associated switching devices to provide desired DC voltage across the load, namely at OUT+ or OUT−. For example, the driver system 118 can include an associated switching system (separate from the switching system 104) that is controlled to provide a desired low voltage at OUT+ or OUT−, such as by operating MOSFET transistors in their linear region. Alternatively, as indicated by dotted line 122, the linear driver system 118 can share the switching system 104 with the switching driver system 116 and operate switches (e.g., MOSFETs) therein in their linear region during the zero crossover condition.

By providing linear voltage (as compared to switching voltage) at OUT+ and OUT− during a zero crossing condition, noise performance and overall linearity can be increased. In addition, since little current is flowing during a zero crossing condition, the impact on efficiency of the system 100 is minimal. In addition, because the switching driver 112 only operates filter-side switching devices in a switching mode (e.g., filter-side switches) and keeps all other switching devices on the other output side in a non-switching mode independent of the direction of current, only a single filter 108 is needed to mitigate switching noise at the output side where the switching mode is implemented. This results in a substantial savings in the real estate in an integrated circuit implemented in accordance with an aspect of the present invention.

By way of example, the load 106 can be a thermoelectric cooler system. Thus, the other input can correspond to a voltage operative to achieve a desired temperature characteristic of a device or portion of a device that the thermal electric cooler is to heat or cool accordingly. A thermoelectric cooler typically operates using the Peltier cooling effect, which causes an absorption or generation of heat as current passes through a junction of two dissimilar materials. For example, thermoelectric elements (not shown) of thermoelectric cooler can be formed from semiconductor materials, such as bismuth telluride, having desired dissimilar characteristics. A typical thermoelectric cooler implemented as the load 106, for example, has two leads (e.g., coupled between OUT+ and the filter 108 in the example of FIG. 6). The switching system 104 provides a potential across the leads so that the thermoelectric elements to produce desired heating and cooling effects. It will be understood and appreciated that when the load 106 is implemented as a thermoelectric cooler, any thermoelectric cooler or other suitable device, such as a light emitting diode (LED) or thin film resistor, to alternately heat or cool can be utilized according to an aspect of the present invention. By way of further illustration, the input(s) to the system 100 can correspond to a temperature regulation signal to maintain a desired temperature of the thermoelectric cooler or other device that the cooler is trying to cool (or heat). It will be appreciated that the particular modulation scheme described herein is particularly useful for thermoelectric coolers and other devices usually driven with current in a single direction. This is because efficient switching can be implemented to drive the load 106 with few transitions in the current direction.

Figure 7:
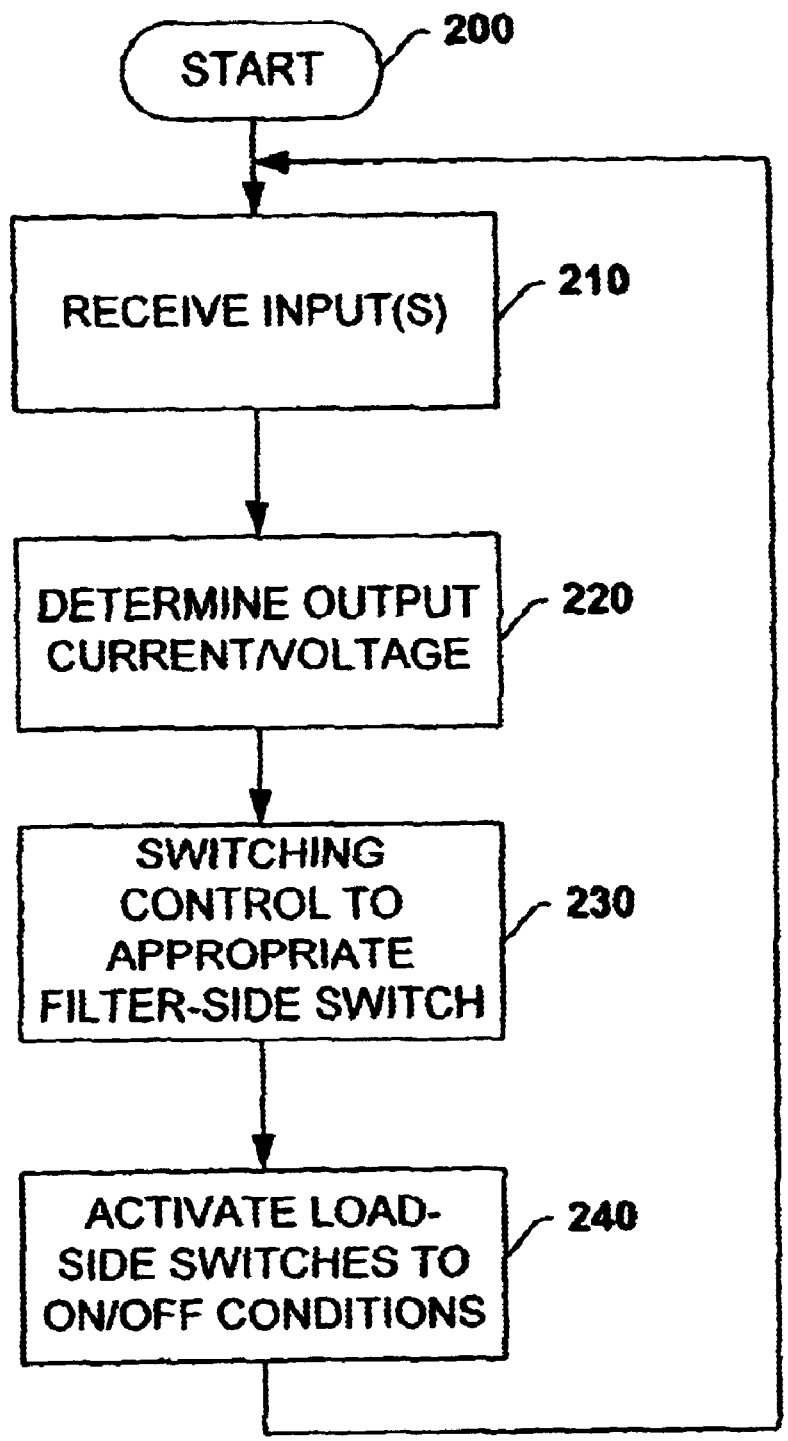
FIG. 7 is a flow diagram illustrating a methodology for implementing a switching modulation scheme according to an aspect of the invention.
Figure 8:
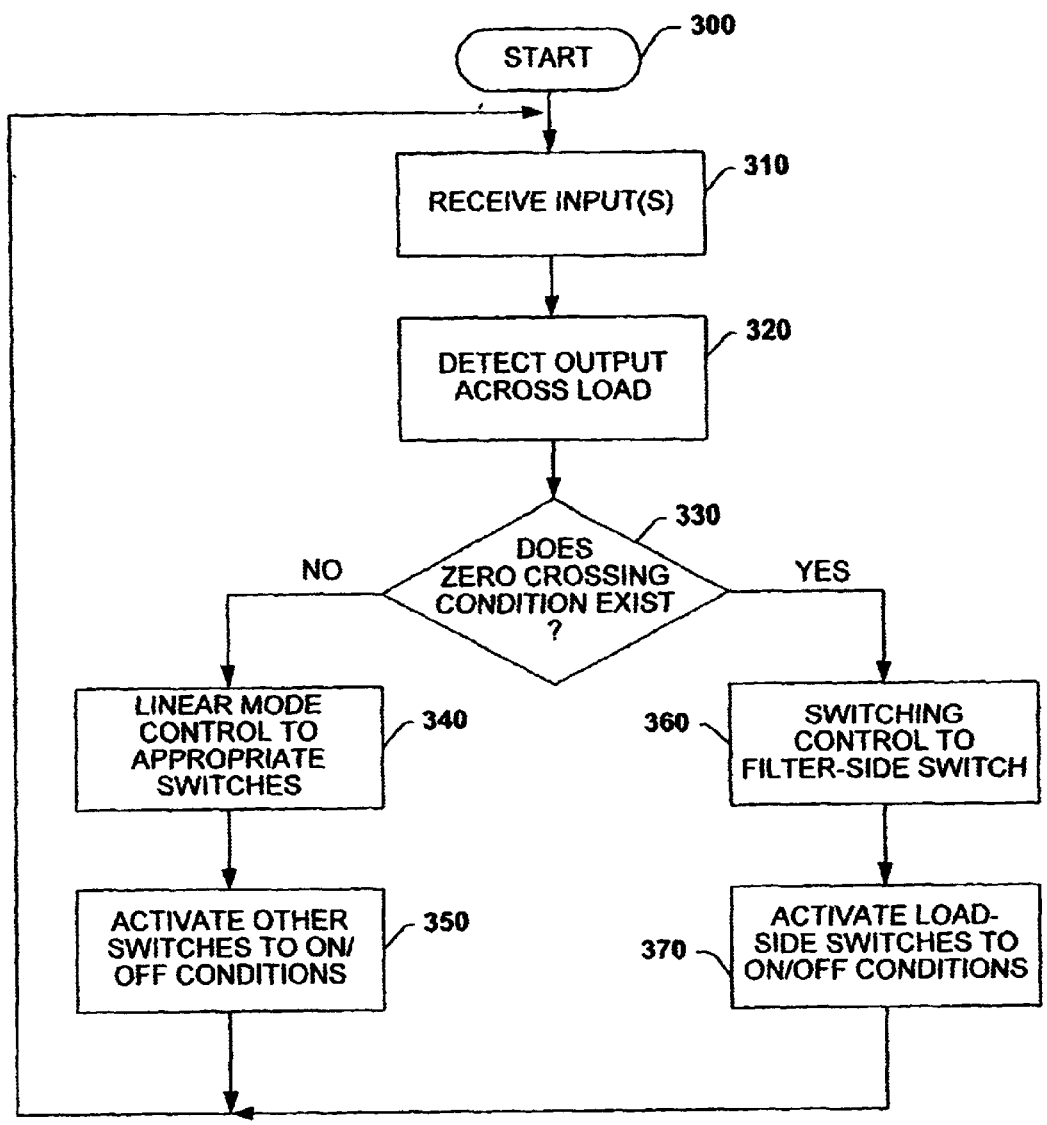
FIG. 8 is a flow diagram illustrating a methodology for implementing a hybrid switching and linear modulation scheme according to an aspect of the invention.

In view of the foregoing structural and functional features described above, methodologies in accordance with various aspects of the present invention will be better appreciated with reference to FIGS. 7 and 8. While, for purposes of simplicity of explanation, the methodologies of FIGS. 7 and 8 are shown and described as executing serially, it is to be understood and appreciated that the present invention is not limited by the illustrated order, as some aspects could, in accordance with the present invention, occur in different orders and/or concurrently with other aspects from that shown and described herein. For example, the illustrated methodologies could be represented as a state diagram in which various states exhibit different functionality. Moreover, not all illustrated features may be required to implement a methodology in accordance with an aspect the present invention. Those skilled in the art will understand and appreciate that the following methodologies can be implemented as hardware, software or a combination of hardware and software.

Turning to FIG. 7, a flow diagram is illustrated corresponding to a methodology for implementing a modulation scheme for a switching amplifier that reduces filter requirements in accordance with an aspect of the present invention. The methodology begins at 200, such as in connection with applying power to an integrated circuit implementing the following methodology. The methodology corresponds to control that can be provided to a switching system for providing an output (e.g., a differential output signal) relative to a load coupled to the switching system. The switching system includes a plurality of switches coupled between different voltages (e.g., between a power supply and ground) to enable current to flow through the respective switches when activated in an appropriate manner. The load is coupled between different sets of transistors, such as a set of filter-side transistors and a set of load-side transistors coupled between a single power supply and ground.

Turning to FIG. 7, at 210, one or more input signals are received, such as from one or more sensors or associated control circuitry that provide information based on which control can be implemented to provide desired electrical energy to the load. Next, at 220, an output current or voltage to be applied relative to the associated load is determined based on the inputs at 210. In addition, feedback can be employed to facilitate providing the desired current or voltage relative to the load.

Based on the determined energy requirements for the load, at 230, switching control is provided to the appropriate filter-side switch or switches. The switching control is provided as a series of pulses (e.g., switching between on and off conditions) having a duty cycle designed to provide the desired output to the load (based on the input(s) at 210). As a result, a corresponding switching output signal is provided at the filter-side output.

At 240, the load-side switches are activated to their appropriate on or off conditions to route current through the load in the appropriate direction as determined at 220. From 240, the methodology returns to 210 where the process can repeat. It will be understood and appreciated that the foregoing methodology only operates the filter-side switches in a switching mode independent of the direction of current. Thus, only a single filter connected between the load and those switches that operate in their switching mode is required. Because only a single filter is needed, significant space savings can be implemented in a circuit (e.g., PCB) implementing such a methodology. Such a methodology is particularly efficient for applications in which current generally flows in only a single direction, such as thermal electric coolers, audio speakers and the like.

FIG. 8 is another flow diagram illustrating a methodology for implementing a modulation scheme to drive a load in accordance with an aspect of the present invention. The methodology begins at 300, such as in connection with powering up a system or integrated circuit implementing the respective methodology. At 310, one or more input signals are received corresponding to a desired output voltage or current. The input signal(s) can be derived based on one or more conditions of a load or a condition associated with the load.

At 320, an output across the load also may be detected. Such detection can include an actual determination of the voltage potential or current across the load or simply a determination of whether the output voltage exceeds or is below a particular threshold. Alternatively, the input signal received at 310 can be a voltage control signal determined based at least in part on the output voltage, in which case the output across the load need not be expressly detected.

At 330, a determination is made as to whether a zero crossing condition exists. Such a determination can be made, for example, based on comparing the input (310) or output (320) relative to a threshold, and selectively enabling one of the pair of driver control systems based on the output across the load. Thus, if a zero crossing condition does not exist, the methodology proceeds to 340.

At 340, linear mode control is provided to appropriate switches in the switching system. The linear mode control, for example, operates respective MOSFET devices in their linear region so as to provide a low voltage and substantially linear output to the respective load. At 350, the other switches are activated to their appropriate on or off conditions so that an appropriate current direction is established to provide current to the load based on the inputs at 310. From 350, the methodology returns to 310, the foregoing can be repeated based upon the more current circuit conditions.

If the determination at 330 is affirmative, indicating that a zero crossing condition exists (e.g. the output across the load does exceed a threshold), the methodology proceeds to 360. At 360, switching control can be implemented relative to one or more filter-side switches. The filter-side switches are controlled with a pulsed signal having a duty cycle so as to achieve a desired output across the load. At 370, the load side switches and the other filter-side switch are activated to corresponding on and off conditions so that current flows through the load in a desired manner. Because switching is implemented only with respect to the filter-side switches, only a single filter is needed between the output node to which the filter-side switches are coupled and the load. This results in a significant space savings on the integrated circuit implementing such methodologies. In addition, by implementing a hybrid switching mode and linear mode control, the overall performance of the driver and switching devices as well as cost can be reduced when compared to conventional systems.

What has been described above includes examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A control system for controlling a plurality of switching devices coupled to drive a load connected between first and second output nodes, the control system comprising:
    a switching driver system that provides a switching control signal to at least one of the plurality or switching devices associated with the first output node so that a switching output signal occurs at the first output node independent of a direction of current flow, the switching driver system also providing non-switching control signals to respective other of the plurality or switching devices to control the direction of current flow relative to the load, and
    a detector to detect a zero crossing condition and to control said switching driver system in accordance with said zero crossing condition.

2. The system of claim 1, further comprising a filter coupled between the load and the first output node to mitigate noise due to the switching output signal at the first output node.

3. The system of claim 2, the output node corresponding to a juncture between each of the switching devices associated with the first output node.

4. The system of claim 1, further comprising a linear driver system coupled to provide a generally linear output to at least one of the first and second output nodes during a zero crossing condition.

5. The system of claim 4, the linear driver system being configured to apply the generally linear output directly to the at least one of the first and second output nodes.

6. The system of claim 1 implemented as at least part of an integrated circuit.

7. The system of claim 1, further comprising a single power supply connected to some of the switching devices to supply electrical energy to the load.

8. The system of claim 1, the load further comprising a thermoelectric cooler.

9. A control system for controlling a plurality of switching devices coupled to drive a load connected between first and second output nodes, the control system comprising:
    a switching driver system that provides a switching control signal to at least one of the plurality of switching devices associated with the first output node so that a switching output signal occurs at the first output node independent of a direction of current flow, the switching driver system also providing non-switching control signals to respective other of the plurality of switching devices to control the direction of current flow relative to the load,
    a linear driver system coupled to provide a generally linear output to at least one of the first and second output nodes during a zero crossing condition, and
    a mode control system that detects an occurrence of a zero crossing condition and enables one of the switching driver system and the linear driver system based on the detection.

10. The system of claim 9, the plurality of switching devices defining a switching system, the mode control system enabling the linear driver system during a zero crossing condition to control the switching system to provide the generally linear output, whereby the switching system is shared by the linear driver system and the switching driver system depending on a mode of the system based on the occurrence of a zero crossing condition.

11. The system of claim 10, each of the plurality of switching devices in the switching system comprising a MOSFET, in the absence of a zero crossing condition, the switching driver system providing the switching control signal to operate at least one of the MOSFETs associated with the first output node in an active region thereof so that the switching output signal occurs at the first output node with an associated duty cycle, the switching driver system providing non-switching control signals to respective other of the MOSFETs so as to be either on or off, and the linear driver system controlling at least one of the MOSFETs in a linear region thereof during the occurrence of a zero crossing condition to provide the generally linear output.

12. A modulation system for driving a load coupled between first and second of outputs of the modulation system, comprising
    a first set of switching devices coupled to the first output;
    a second sot of switching devices coupled to the second output;
    a control system that controls operation of the switching devices, such that at least one switching device of the first set switching devices operates to provide a switching signal at the first output independently of a direction of current flow relative to the first and second outputs, the control system controlling the second set of switching devices to control the direction of current flow and to provide a non-switching output at the second output, and
    a detector to detect a zero crossing condition and to control operation of said switching devices based on said zero crossing condition.

13. The system of claim 12, further comprising a filter coupled between the load and the first output to mitigate noise due to the switching signal at the first output.

14. The system of claim 12, the control system further comprising a mode control system that detects an occurrence of a zero crossing condition and sets an operating mode of system based on the detection.

15. The system of claim 14, the control system further comprising a linear driver system and a switching driver system, one of which operates to drive the load depending on the operating mode of the system.

16. The system of claim 15, the linear driver system being configured to apply a generally linear output directly to at least one of the first and second outputs without employing switching devices in the first and second sets of switching devices.

17. The system of claim 12 implemented as at least part of an integrated circuit.

18. The system of claim 12, the first and second sets of switching devices arranged in a bridge configuration between a single power supply and ground.

19. The system of claim 12, the load comprising a thermoelectric cooler.

20. A modulation system for driving a load coupled between first and second of outputs of the modulation system, comprising:

a first set of switching devices coupled to the first output;

a second set of switching devices coupled to the second output;

a control system that controls operation of the switching devices, such that at least one switching device of the first set switching devices operates to provide a switching at the first output independently of a direction of current flow relative to the first and second outputs, the control system controlling the second set of switching devices to control the direction of current flow and to provide a non-switching output at the second output, a linear driver system, one of which operates to drive the load depending on the operating mode of the system, and wherein the absence of zero crossing condition defines a switching mode, the mode control system enabling the switching driver while in switching mode to control the at least one switching device at the first set of switching devices so that the switching signal is provided at the first output with an associated duty cycle to provide a desired voltage to the load.

21. The system of claim 20, each of the switching devices comprising a MOSFET, in the switching mode, the control system controlling at least one of the MOSFETs associated with the first output in an active region thereof so that the switching signal occurs at the first output, the other MOSFETs being either on or off during the switching mode to control the direction of current flow.

22. A modulation system for driving a load coupled between first and second of outputs of the modulation system, comprising:

a first set of switching devices coupled to the first output;

a second set of switching devices coupled to the second output;

a control system that controls operation of the switching devices, such that at least one switching device of the first set switching devices operates to provide a switching signal at the first output independently of a direction of current flow relative to the first and second outputs, the control system controlling the second set of switching devices to control the direction of current flow and to provide a non-switching output at the second output, a linear driver system and a switching driver system, one of which operates to drive the load depending on the operating mode of the system, wherein the occurrence at the zero crossing condition defines a linear mode of the system, the mode control system enabling the linear driver system while in the linear mode to provide a generally linear output to at least one of the first and second outputs.

23. The system of claim 22, in the linear mode, the control system controlling at least one of a plurality of MOSFETs in a linear region thereof to provide the generally linear output.

24. A modulation system for driving a load coupled between first and second of outputs of the modulation system, comprising:

a first set at switching devices coupled to the first output;

a second set of switching devices coupled to the second output;

a control system that controls operation of the switching devices, such that at least one switching device of the first set switching devices operates to provide a switching signal at the first output independently of a direction of current flow relative to the first and second outputs, the control system controlling the second set of switching devices to control the direction of current flow and to provide a non-switching output at the second output, a linear driver system and a switching driver system, one of which operates to drive the load depending on the operating mode of the system, and wherein the first and second sets of switches defines a switching system, the linear driver system controlling the switching system during the zero crossing condition to provide a generally linear output to at least one of the first and second outputs, the mode control system enabling the switching driver to operate while in the switching mode to control the at least one switching device of the first set of switching devices so that the switching signal is provided at the first output with an associated duty cycle to provide a desired voltage to the load, whereby the switching system is shared by the linear driver system and the switching driver system depending on the operating mode.

25. The system of claim 14, the switching devices of the switching system comprising MOSFETs.

26. A system for driving a load coupled between first and second of outputs of the system, comprising:

a detector that detects an occurrence of a zero crossing condition associated with the load; and a control system that includes a linear driver system operative to apply a substantially linear low voltage signal to at least one of the first and second outputs based on the detector detecting the occurrence of a zero crossing condition, wherein the control system further comprises a switching driver system, in the absence of a zero crossing condition, the switching driver system being operative to provide a switching control signal to at least one of a plurality of switching devices that are associated with the first output so that a switching output signal occurs at the first output independent of a direction of current flow, the switching driver system also controlling respective other of the plurality of switching devices to implement a desired direction of current flow relative to the load and to provide a non-switching signal at the second output.

27. The system of claim 26, further comprising a filter coupled between the load and the first output to mitigate nose due to the switching output signal at the one of the first and second outputs.

28. A method for controlling a plurality of switch devices to provide electrical energy from a power supply to an associated load coupled between at least a pair of output nodes, a first set of the switch devices connected to a first output node of the pair of output nodes, a second set of switch devices connected to a second output node of the pair of output nodes, the method comprising:

operating at least one switch device of the first set of switch devices to provide a switching output signal at the first output node independent of a direction of current flow through the load;

operating the second set of switch devices to control the direction of current flow through the load and to provide a non-switching output signal at the second output node, determining an operating mode based on the occurrence of a zero crossing condition; and operating in a linear mode based on the determination indicating the occurrence of a zero crossing condition; and operating in a switching mode in the absence of the occurrence of a zero crossing condition.

29. The method of claim 28, further comprising filtering the signal between the first output node and the load, with no filtering being performed between the second output node and the load.

30. The method of claim 28, when in the linear mode, the method further comprising applying a substantially linear low voltage signal to at least one of the first and second output nodes.

31. The method of claim 30, when in the switching mode, the method further comprising providing the switching output signal at the first output node and the non-switching signal at the second output node independently of the direction of current through the load.

* * * * *